(12) United States Patent
Hsu et al.

(10) Patent No.: US 9,990,985 B1
(45) Date of Patent: Jun. 5, 2018

(54) MEMORY DEVICE WITH DETERMINED TIME WINDOW

(71) Applicant: Taiwan Semiconductor Manufacturing Co., Ltd., Hsin-Chu (TW)

(72) Inventors: Kuoyuan Hsu, San Jose, CA (US); Sung-Chieh Lin, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/429,091

(22) Filed: Feb. 9, 2017

Related U.S. Application Data

(60) Provisional application No. 62/428,393, filed on Nov. 30, 2016.

(51) Int. Cl.
G11C 11/00 (2006.01)
G11C 11/419 (2006.01)
(52) U.S. Cl.
CPC .................. *G11C 11/419* (2013.01)
(58) Field of Classification Search
CPC .................................... G11C 11/419
USPC ........................................ 365/154, 233.11
See application file for complete search history.

(56) References Cited

U.S. PATENT DOCUMENTS

| 8,605,523 | B2 | 12/2013 | Tao et al. |
| 8,630,132 | B2 | 1/2014 | Cheng et al. |
| 8,760,948 | B2 | 6/2014 | Tao et al. |
| 8,908,421 | B2 | 12/2014 | Liaw |
| 8,929,160 | B2 | 1/2015 | Katoch et al. |
| 8,964,492 | B2 | 2/2015 | Hsu et al. |
| 8,982,643 | B2 | 3/2015 | Lum |
| 9,117,510 | B2 | 8/2015 | Yang et al. |
| 9,208,858 | B1 | 12/2015 | Lin et al. |
| 9,218,872 | B1 | 12/2015 | Liaw |
| 2012/0206983 | A1* | 8/2012 | Zhang .................... G11C 7/227 365/194 |
| 2013/0242678 | A1* | 9/2013 | Wang .................... G11C 11/419 365/191 |
| 2014/0032871 | A1* | 1/2014 | Hsu ........................ G11C 11/419 711/167 |
| 2014/0153345 | A1 | 6/2014 | Kim et al. |
| 2014/0233330 | A1 | 8/2014 | Ko et al. |
| 2014/0375858 | A1* | 12/2014 | Lee ........................ H03K 4/026 348/308 |
| 2015/0348598 | A1 | 12/2015 | Wang et al. |
| 2015/0371702 | A1 | 12/2015 | Wu et al. |
| 2015/0380077 | A1 | 12/2015 | Wu et al. |
| 2015/0380078 | A1 | 12/2015 | Liaw |

* cited by examiner

*Primary Examiner* — Anthan Tran
(74) *Attorney, Agent, or Firm* — Duane Morris LLP

(57) ABSTRACT

A memory device includes a memory array that comprises at least a bit cell configured to store a data bit; a tracking circuit, coupled to the memory array, and configured to provide an enable signal in response to a first timing edge of a clock signal, wherein the enable signal emulates an electrical signal path propagating the memory array; and a control logic circuit comprising a timing control engine coupled to the tracking circuit, wherein the timing control engine is configured to select a faster timing edge between a second timing edge of the clock signal and a third timing edge of the enable signal so as to terminate an ongoing operation of the bit cell.

16 Claims, 4 Drawing Sheets

MEMORY DEVICE WITH DETERMINED TIME WINDOW

CROSS-REFERENCE TO RELATED APPLICATION

The present application claims priority to U.S. Provisional Patent Application No. 62/428,393, filed on Nov. 30, 2016, which is incorporated by reference herein in its entirety.

BACKGROUND

Static random access memory (SRAM) device is a type of volatile semiconductor memory that stores data bits using bistable circuitry that does not need refreshing. An SRAM device typically includes one or more memory arrays, wherein each array includes a plurality of SRAM cells. An SRAM cell is typically referred to as a bit cell because it stores one bit of information, represented by the logic state of two cross coupled inverters. Each memory array includes multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters, which otherwise float. A word line may be coupled to plural bit cells along a row of a memory array, with different word lines provided for different rows.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
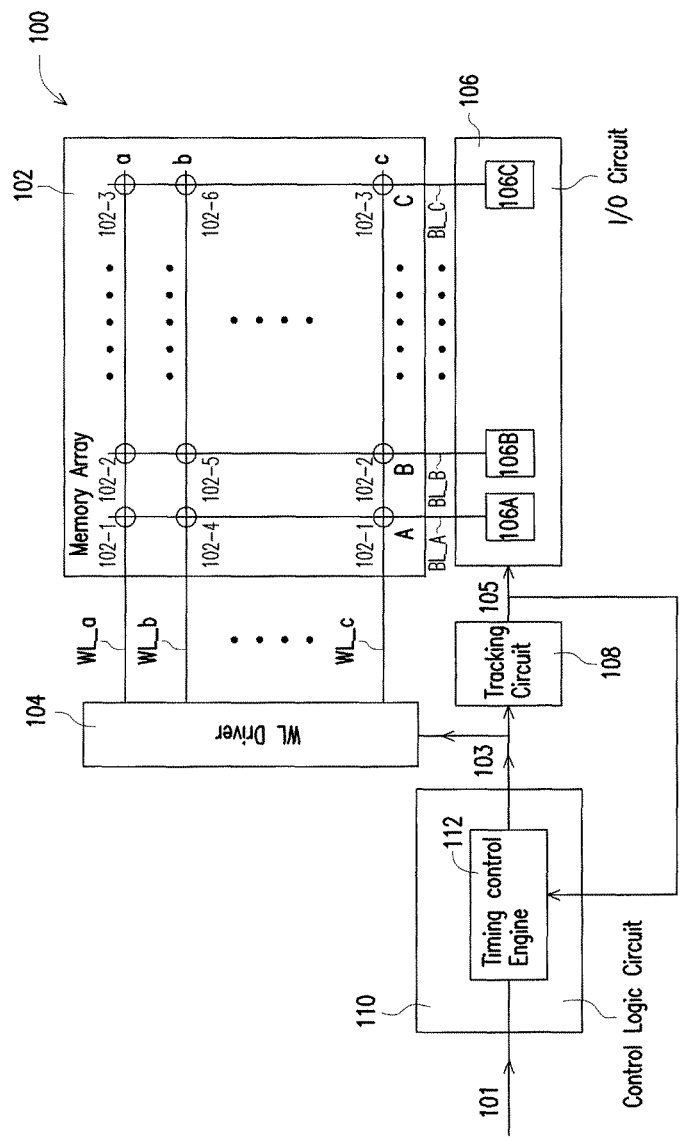
FIG. 1 illustrates an exemplary block diagram of a memory device that includes a timing control engine coupled to a memory array, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In general, when a bit cell is accessed (e.g., during a read/write operation), a word line pulse signal is provided to assert the bit cell's corresponding word line. Upon the corresponding word line being asserted, either a read operation or a write operation can be performed on the bit cell during a time duration when the word line pulse signal remains at a high logical state. Conventionally, the time duration of the word line pulse signal is governed by a global clock signal provided to the whole SRAM device. As such, a time window for performing an operation is purely determined by a speed (i.e., frequency) of the global clock signal. Although a long enough time duration of the word line pulse signal (e.g., an elongated falling edge of the word line pulse signal) may assure a proper operation being performed, additional and unnecessary power consumption may be induced, which disadvantageously impacts the whole SRAM device. To address this, one or more conventional tracking circuits, either coupled to or integrated into the SRAM device, are used to emulate a signal path across the SRAM device to perform a respective operation so as to decide when the falling edge of the word line pulse signal should occur by providing a timing tracking signal. Although such a tracking circuit provides a relatively accurate time window for performing an operation, the tracking timing signal generally includes a substantial amount of (time) margins in order to take the worst case condition of variations (e.g., Process-Voltage-Temperature corners) into account. The tracking timing signal may be inherently slower than the global clock signal. As such, even though a fast global clock signal is provided, the conventional tracking circuit cannot use such an advantage. Thus, conventional SRAM devices are not entirely satisfactory.

The present disclosure provides various embodiments of a memory device architecture including a timing control engine that is configured to provide an accurate time window for performing an operation (e.g., either a read or a write operation) on a bit cell of a memory array. More specifically, the timing control engine, included in a control logic circuit coupled to the memory array, compares a global clock signal and a simulated enable signal to determine the time window. In some embodiments, when a fast global clock signal is provided to the whole memory device, the timing control engine may use a rising edge and select a falling edge of the fast global clock signal to provide the time window. On the other hand, when a slow global clock signal is provided, the timing control engine may still use a rising edge of the slow global clock signal but select a falling edge of the simulated enable signal to provide the time window, rather than waiting for arrival of the falling edge of the slow global clock signal. As such, the above-identified issues (e.g., unnecessary power consumption, failure of using a fast global clock signal, etc.) that typically occurs in conventional SRAM devices may be advantageously avoided.

FIG. 1 illustrates an exemplary block diagram of a memory device 100 in accordance with various embodiments. As shown, the memory device 100 includes a memory array 102, a word line (WL) driver 104, an input/output (I/O) circuit 106, a tracking circuit 108, and a control logic circuit 110 including a timing control engine 112. In some embodiments, the memory array 102 includes a plurality of bit cells (e.g., 102-1, 102-2, 102-3, 102-4, 102-5, 102-6, 102-7, 102-8, 102-9, etc.) that are arranged in a column-row configuration; the WL driver 104 is coupled to the bit cells through one or more WL's (e.g., WL_a, WL_b, WL_c, etc.); the I/O circuit 106 is coupled to the memory array 102 through one or more bit lines (BL's) (e.g., BL_A, BL_B, BL_C, etc.); and the tracking circuit 108 is coupled between the control logic circuit 110 and the I/O circuit 106. The column-row configuration of the memory array 102, i.e., the bit cells (102-1-102-9), the WL's (WL_a, WL_b, and WL_c), and the BL's (BL_A, BL_B, and BL_C), will be discussed in further detail below.

Although, in the illustrated embodiment of FIG. 1, each component is shown as a separate block for purposes of clear illustration, in some other embodiments, some or all of the components shown in FIG. 1 may be integrated together. For example, the tracking circuit 108 may include one or more tracking bit cells, and corresponding WL and BL, that are disposed within the memory array 102. An exemplary embodiment of the tracking circuit 108 will be discussed with respect to FIG. 2B.

In some embodiments, the memory array 102 may include a static random access memory (SRAM) block. However, any of a variety of memory blocks (e.g., an RRAM block, a DRAM block, an MRAM block, etc.) may be implemented as the memory array 102 while remaining within the scope of the present disclosure. As mentioned above, in some embodiments, the bit cells of the memory array 102 are arranged in a column-row configuration in which each column has a bit line (BL) and a bit bar line (BBL) and each row has a word line (WL). More specifically, the BL and BBL of each column are respectively coupled to a plurality of bit cells that are disposed in that column, and each bit cell in that column is arranged on a different row and coupled to a respective (different) WL. That is, each bit cell of the memory array 102 is coupled to a BL of a column of the memory array 102, a BBL of the column of the memory array 102, and a WL of a row of the memory array 102. In some embodiments, the BL's and BBL's are arranged in parallel vertically and the WL's are arranged in parallel horizontally (i.e., perpendicular to the BL's and BBL's).

In the illustrated embodiment of FIG. 1, 9 bits (e.g., 102-1, 102-2, 102-3, 102-4, 102-5, 102-6, 102-7, 102-8, and 102-9) are shown in the memory array 102. Based on the above description, columns "A," "B," and "C," and rows "a," "b," and "c" are accordingly shown in the memory array 102. The bit cells 102-1, 102-4, and 102-7 are arranged along column A; the bit cells 102-2, 102-5, and 102-8 are arranged along column B; the bit cells 102-3, 102-6, and 102-9 are arranged along column C; the bit cells 102-1, 102-2, and 102-3 are arranged along row a; the bit cells 102-4, 102-5, and 102-6 are arranged along row b; and the bit cells 102-7, 102-8, and 102-9 are arranged along row c. Moreover, the bit cells 102-1, 102-4, and 102-7 arranged along column A are all coupled to a respective BL of column A, "BL_A," and are each coupled to a WL of the respective row: WL_a, WL_b, and WL_c; the bit cells 102-2, 102-5, and 102-8 arranged along column B are all coupled to a respective BL of column B, "BL_B," and are each coupled to a WL of the respective row: WL_a, WL_b, and WL_c; the bit cells 102-3, 102-6, and 102-9 arranged along column C are all coupled to a respective BL of column C, "BL_C," and are each coupled to a WL of the respective row: WL_a, WL_b, and WL_c.

As mentioned above, the bit cells of the memory array 102 along a row are coupled to the WL driver 104 through a common WL, and the bit cells of the memory array 102 along a column are coupled to a sensing amplifier of the I/O circuit 106 through a common BL. For example, in the illustrated embodiment of FIG. 1, the bit cells 102-1, 102-2, and up to 102-3 along row "a" are coupled to the WL driver 104 through the WL, WL_a; the bit cells 102-4, 102-5, and up to 102-6 along row "b" are coupled to the WL driver 104 through the WL, WL_b; and the bit cells 102-7, 102-8, and up to 102-9 along row "c" are coupled to the WL driver 104 through the WL, WL_c. And the bit cells 102-1, 102-4, and up to 102-7 along column "A" are coupled to sensing amplifier 106A of the I/O circuit 106 through the BL, BL_A; the bit cells 102-2, 102-5, and up to 102-8 along column "B" are coupled to sensing amplifier 106B of the I/O circuit 106 through the BL, BL_B; and the bit cells 102-3, 102-6, and up to 102-9 along column "C" are coupled to sensing amplifier 106C of the I/O circuit 106 through the BL, BL_C.

Although the illustrated embodiment of FIG. 1 shows only 9 bit cells, any desired number of bit cells may be included in the embodiment of the memory array 102 while remaining within the scope of the present disclosure. As such, the number of columns and rows (and corresponding BL's/BBL's and WL's) can be adjusted in accordance with the number of bits in the memory array 102. Also, for purposes of brevity, only BL's, instead of both the BL's and BBL's, are shown along respective columns of the memory array 102 in FIG. 1.

In some embodiments, each bit cell of the memory array 102 is configured to store/present a data bit, or a datum. Such a data bit may be repeatedly read out from (i.e., a read operation) or written to (i.e., a write operation) each bit cell with a respective logical state (i.e., either a logical 1 or a logical 0). In the following discussions, each bit cell includes a 6-transistor (6T) SRAM bit cell, which will be discussed in further detail with respect to FIG. 2A.

In some embodiments, the control logic circuit 110 is configured to receive a global clock signal 101 and provide an assert signal 103 so as to activate the WL driver 104 and the tacking circuit 105. Such a global clock signal 101 may be provided to the whole memory device 100, or more generally, to a whole device in which the memory device 100 is embedded, for example, a microcontroller circuit, a system-on-chip circuit (SoC), etc. As understood by people of ordinary skill in the art, the clock signal 101 may be provided by a clock generation circuit, for example, a phase-locked-loop (PLL) circuit. In some embodiments, the assert signal 103, provided by the control logic circuit 110, may be a clocked signal and include various information such as, for example, address information, a type of operation (either a read operation or a write operation), etc. More specifically, upon receiving the assert signal 103, the WL driver 104 is configure to assert a corresponding WL (e.g., WL_a, WL_b, WL_c, etc.) based on the address information so as to allow one or more bit cells coupled to the asserted WL to be read or written, and while the one or more bit cell(s) are undergoing a read or a write operation, the tracking circuit 108 is configured to emulate a loading (e.g., a resistor-capacitor (RC) behavior of the BL's) of the memory array 102 so as to provide an enable signal 105. The enable signal 105 is used to activate one or more sensing amplifiers (e.g., 106A, 106B, 106C, etc.) that respectively correspond to the one or more bit cells undergoing an operation.

Further, according to some embodiments of the present disclosure, the timing control engine 112 of the control logic circuit 110 receives the emulated enable signal 105 as a feedback signal, and compares the clock signal 101 and the emulated enable signal 105 to determine which of these two signals has a faster falling edge. The determined faster falling edge is then used by the control logic circuit 110 to terminate the present operation. As such, the above-identified issues (e.g., failure of using a fast global clock signal, consuming additional and unnecessary power, etc.) faced by the conventional memory device can be advantageously avoided. Details of the operation of the disclosed memory device 100 will be discussed in further detail below. Before discussing the operation of the memory device 100, exemplary embodiments of the bit cell of the memory array 102 and the tracking circuit 108 will be discussed in FIGS. 2A and 2B, respectively.

Figure 2A:
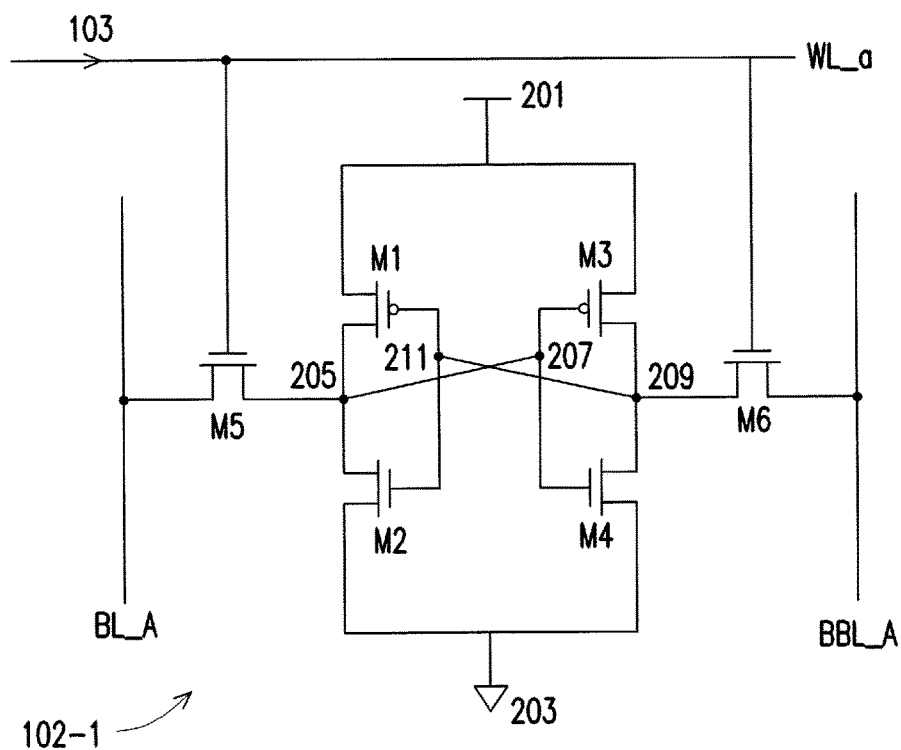
FIG. 2A illustrates an exemplary circuit diagram of an embodiment of a memory bit cell of the memory device of FIG. 1, in accordance with some embodiments.

Referring now to FIG. 2A, a circuit diagram of one of the bit cells (e.g., 102-1) of the memory array 102 is illustrated, in accordance with various embodiments of the present disclosure. It is noted that since the bit cells of the memory array 102 are substantially similar to one another, only the circuit diagram of the bit cell 102-1 is illustrated and discussed. As mentioned above, each bit cell (e.g., 102-1) includes a 6T-SRAM bit cell in some embodiments of the current disclosure. In some other embodiments, the bit cell of the memory array 102 may be implemented as any of a variety of SRAM bit cells such as, for example, 2T-2R SRAM bit cell, 4T-SRAM bit cell, 8T-SRAM bit cell, 10T-SRAM bit cell, etc. Among the above-provided examples, the 6T-SRAM bit cell, the 2T-2R SRAM bit cell, and the 4T-SRAM bit cell are typically referred to as "single-port" bit cells; the 8T-SRAM bit cell and the 10T-SRAM bit cell are typically referred to as "double-port," or "single-ended" bit cells. Although the discussion of the embodiments of the current disclosure is directed to the single-port bit cell (e.g., the 6T-SRAM bit cell), it is understood that various embodiments of the current disclosure can also be used in any of a variety of single-ended bit cells.

Further to the embodiments of the 6T-SRAM bit cell, as shown in FIG. 2A, the bit cell 102-1 includes 6 transistors: M1, M2, M3, M4, M5, and M6. The transistor M1 and M2 are formed as a first inverter and the transistors M3 and M4 are formed as a second inverter wherein the first and second inverters are coupled to each other. More specifically, the first and second inverters are each coupled between first voltage reference 201 and second voltage reference 203. Generally, the first voltage reference 201 is a voltage level of a supply voltage applied to the memory device 100. The first voltage reference 201 is typically referred to as "Vdd." The second voltage reference 203 is typically referred to as "ground." Further, the first inverter (formed by the transistors M1 and M2) is coupled to the transistor M5, and the second inverter (formed by the transistors M3 and M4) is coupled to the transistor M6. In addition to being coupled to the first and second inverters, the transistors M5 and M6 are each coupled to the WL, "WL_a," and are coupled to the BL and BBL of column A, "BL_A" and "BBL_A," respectively. Typically, the transistors M1 and M3 are referred to as pull-up transistors of the bit cell 102-1; the transistors M2 and M4 are referred to as pull-down transistors of the bit cell 102-1; and the transistors M5 and M6 are referred to as access transistors of the bit cell 102-1. In some embodiments, the transistors M2, M4, M5, and M6 each includes an NMOS transistor, and M1 and M3 each includes a PMOS transistor. Although the illustrated embodiments of FIG. 2A shows that M1-M6 are either NMOS or PMOS transistors, any of a variety of transistors or devices that are suitable for use in a memory device may be implemented as at least one of M1-M6 such as, for example, a bipolar junction transistor (BJT), a high-electron-mobility transistor (HEMT), etc.

Continuing with the discussion of the bit cell 102-1, in some embodiments, the access transistors M5 and M6 each has a gate that is coupled to the WL_a. The gates of the transistors M5 and M6 are configured to receive a pulse signal, through the WL_a, to allow or block an access of the bit cell 102-1 accordingly, which will be discussed in further detail below. The transistors M2 and M5 are coupled to each other at node 205 with the transistor M2's drain and the transistor M5's source. The node 205 is further coupled to a drain of the transistor M1 and node 207. The transistors M4 and M6 are coupled to each other at node 209 with the transistor M4's drain and the transistor M6's source. The node 209 is further coupled to a drain of the transistor M3 and node 211.

In general, when a bit cell stores a data bit, a first node of the bit cell is configured to be at a first logical state (either a logical 1 or a logical 0), and a second node of the bit cell is configured to be at a second logical state (either a logical 0 or a logical 1), wherein the first and second logical states are complementary with each other. In some embodiments, the first logical state at the first node is the logical state of the data bit stored in the bit cell. For example, in the illustrated embodiment of FIG. 2A, when the bit cell 102-1 store a data bit at a logical 1 state, the node 205 is configured to be at the logical 1 state, and the node 209 is configured to be at the logical 0 state.

To read the logical state of the data bit stored in the bit cell 102-1 (i.e., performing a read operation on the bit cell 102-1), in some embodiments, the BL_A and BBL_A are pre-charged to Vdd (i.e., a logical high). Then the WL_a is asserted, or activated, by an assert signal (e.g., the signal 103). In turn, the access transistors M5 and M6 are turned on in response to a reception of the assert signal provided through the WL_a. More specifically, a rising edge of the assert signal is received at the gates of the access transistors M5 and M6, respectively, so as to turn on the access transistors M5 and M6. Once the access transistors M5 and M6 are turned on, depending on the logical state of the data bit, the pre-charged BL_A or BBL_A may start to be discharged. Subsequently, the BL_A and the BBL_A may respectively present a voltage level so as to produce a large enough voltage difference between the BL_A and BBL_A. Accordingly, a coupled sensing amplifier (e.g., 106A) is configured to use a polarity of the voltage difference to determine whether the logical state of the data bit is a logical 1 or a logical 0.

According to various embodiments of the present disclosure, after a determined time window, the access transistors M5 and M6 are turned off by a falling edge of the assert signal so that a read access of the bit cell 102-1 is blocked. Accordingly, the BL_A/BBL_A stops discharging. The falling edge of the assert signal is selected by comparing at least two respective falling edges of two signals. In some embodiments, the time window is determined by the timing control engine 112 (FIG. 1), and defined as a time duration between the rising edge and the falling edge of the assert signal, which will be discussed in further detail below with respect to FIGS. 3A and 3B. In some embodiments, once the access transistors M5 and M6 are turned off, the read operation is terminated and the bit cell 102-1 returns to a stand-by mode, i.e., the BL_A and BBL_A are again pre-charged to Vdd.

To write a data bit into the bit cell of the memory array 102, a write operation substantially similar to above-described read operation is performed. Thus, for purposes of brevity, the write operation is briefly described herein and the following discussions will be directed to the read operation of the memory device 100. In some embodiments, the write operation starts with pre-charging the BL_A and BBL_A to Vdd. Similar to the read operation, the WL_a is asserted by an assert signal (e.g., signal 103) so that the access transistors M5 and M6 are turned on in response to receiving the rising edge of the assert signal. Then the BL_A and the BBL_A are respectively applied with a logical high and a logical low, or a logical low and a logical high so as to write a logical 1 or a logical 0 to the data bit. In accordance with various embodiments of the present disclosure, after a determined time window that is defined as a time duration between the rising edge and a later determined falling edge of the assert signal, the write operation stops. More specifically, in some embodiments, the write operation stops in response to the access transistors M5 and M6 receiving the falling edge of the assert signal.

Figure 2B:
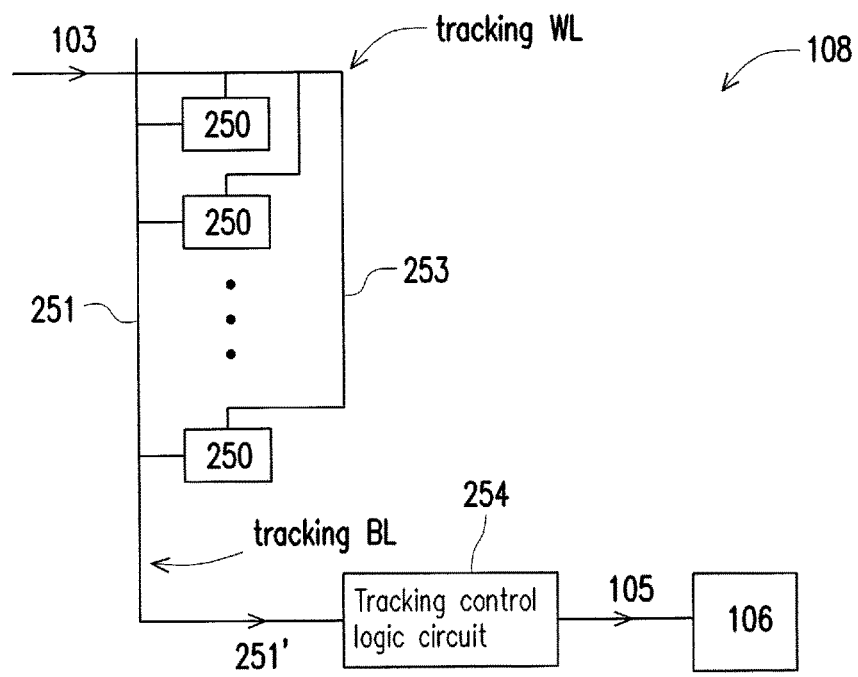
FIG. 2B illustrates an exemplary schematic diagram of an embodiment of a tracking circuit of the memory device of FIG. 1, in accordance with some embodiments.

Referring now to FIG. 2B, a schematic diagram of the tracking circuit 108 is illustrated, in accordance with various embodiments of the present disclosure. As shown, the tracking circuit 108 includes a plurality of tracking cells 250, and a tracking control logic circuit 254 coupled to the plurality of tracking cells 250. In some embodiments, each of the tracking cells 250 is substantially similar to the bit cell (e.g., 102-1 of FIG. 2A) of the memory array 102, and the plurality of tracking cells 250 are arranged in a dummy column, which is also similar to the columns (e.g., columns A, B, C, etc.) of the memory array 102. Further, similar to the bit cells of the memory array 102 along a single column that are coupled to a common BL, the tracking cells 250 are also coupled to a common BL, hereinafter "tracking BL (251)" except that the plurality of tracking cells along the dummy column are coupled to a common WL, hereinafter "tracking WL (253)." More specifically, in some embodiments, the tracking WL 253 is coupled to each tracking cell's access transistors (similar to the transistors M5 and M6 of the bit cell 102-1). As such, the access transistors of all the tacking cells 250 may be simultaneously turned on and off, respectively, in response to receiving a rising edge and a falling edge of an assert signal provided through the tracking WL 253. Details of the operation of the tracking circuit 108 will be discussed in further detail below.

In some embodiments, part of the tracking circuit 108, e.g., the tracking cells 250, the tracking BL 251, and the tracking WL 253, is integrated into the memory array 102. Further to such embodiments, the memory array 102 may include at least one additional column (e.g., a dummy column) arranged substantially adjacent to any of the columns (e.g., column A) of the memory array 102. The plurality of tracking cells 250 are disposed along this additional column, and are each coupled to the BL 251, wherein the tracking BL 251 is selected to have a substantially similar length to a length of the BL (e.g., BL_A, BL_B, BL_C, etc.) of the memory array 102. In the illustrated embodiment of FIG. 2B in which the tracking circuit 108 is disposed as a separate circuit block from the memory array, the tracking BL 251 may also have a substantially similar length to the length of the BL (e.g., BL_A, BL_B, BL_C, etc.) of the memory array 102.

In some embodiments, the tracking circuit 108 is configured to emulate an electrical signal path propagating across the memory array 102. More specifically, as mentioned above, when a bit cell of the memory array 102 is accessed (e.g., read), the bit cell's corresponding WL is first asserted, and then a coupled sensing amplifier detects a large enough voltage difference present between the bit cell's coupled BL and BBL. Since the memory array 102 typically includes a large amount of bit cells (e.g., 256×256 bit cells), each bit cell's respective location in the memory array may cause each of the bit cells to have a distinct electrical signal path (e.g., a distinct portion of BL/BBL) to propagate an electrical signal (e.g., a voltage signal). Different electrical signal paths may have different resistor-capacitor (RC) behaviors. In other words, some of the bit cells may have a relatively shorter electrical signal path, and some of the bit cells may have a relatively longer electrical path. When a bit cell has a short electrical signal path, accordingly, the bit cell may take shorter time to develop a large enough voltage difference between its respective BL and BBL; when a bit cell has a long electrical signal path, the bit cell may take longer time to develop a large enough voltage difference between its respective BL and BBL.

To cause the tacking circuit 108 to emulate an electrical signal path propagating across the memory array 102, in some embodiments, the tracking cells 250 are all written to a same logical state, e.g., a logical 0. Similar to the read operation of the bit cell 102-1, the tracking BL 251 is initially pre-charged to Vdd. Subsequently, the tracking WL 253 is asserted. In some embodiments, when the tracking WL 253 is asserted by a rising edge of an assert signal (e.g., the signal 103), all the tracking cells 250 are allowed to be accessed since the access transistors of all the tracking cells 250 are turned on, as mentioned above. As such, the pre-charged tracking BL 251 is gradually discharged to a logical low state (e.g., ground) by the tracking cells 250. In some embodiments, the tracking control logic circuit 254 is then configured to convert a voltage signal (e.g., 251') present on the tracking BL 251 to the enable signal 105 that is used to activate the I/O circuit 106. More specifically, the enable signal 105 may include a delay in comparison with the assert signal 103 provided through the tracking WL 253. Since, as described above, the length of the tracking BL 251 is selected to be substantially similar to the length of the BL's of the memory array 102, a nominal electrical signal path across the memory array 102 may be simulated. Thus, when the I/O circuit 106 is activated by the enable signal 105, a large enough voltage difference between the bit cell's respective BL and BBL may have been already present. Various exemplary waveforms of the enable signal 105 will be provided and discussed with respect to FIGS. 3A and 3B.

Figure 3A:
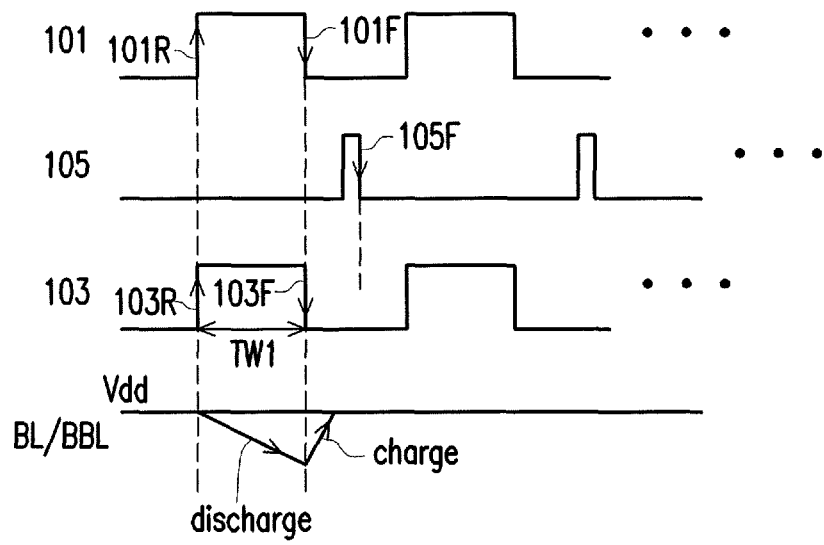
FIG. 3A illustrates a set of exemplary waveforms of plural signals to operate the memory device of FIG. 1 in accordance with some embodiments.
Figure 3B:
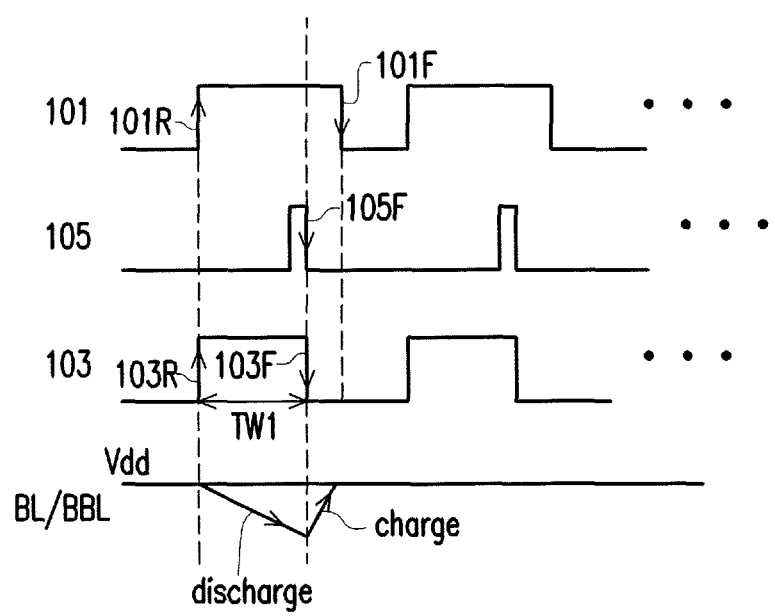
FIG. 3B illustrates another set of exemplary waveforms of plural signals to operate the memory device of FIG. 1, in accordance with some embodiments.

FIGS. 3A and 3B illustrate two exemplary scenarios of a faster clock signal 101 compared with a slower enable signal 105 and a slower clock signal 101 compared with a faster enable signal 105, respectively, in accordance with various embodiments of the present disclosure. More specifically, referring first to FIG. 3A, when the clock signal 101 is compared to the enable signal 105, a falling edge of the clock signal 101 (i.e., 101F) occurs earlier than a falling edge of the enable signal (i.e., 105F). As such, the assert signal 103's falling edge (i.e., 103F) may be determined to be aligned with the falling edge of the faster clock signal 101, 101F. Referring next to FIG. 3B, in some embodiments, when the clock signal 101 is compared to the enable signal 105, the falling edge of the clock signal 101 (i.e., 101F) occurs later than the falling edge of the enable signal (i.e., 105F). As such, the assert signal 103's falling edge (i.e., 103F) may be determined to be aligned with the falling edge of the faster enable signal 105, 105F. Since the clock signal 101, the assert signal 103, and the enable signal 105 are used by the memory device 100 to perform a respective operation, the following discussions of FIGS. 3A and 3B are provided in conjunction with FIGS. 1, 2A, and 2B.

In some embodiments, to perform either a read or a write operation on a bit cell of the memory array 102, e.g., 102-1, the BL_A and BBL_A are initially pre-charged to Vdd that corresponds to a logical 1. Prior to, simultaneously with, or subsequently to the BL_A and BBL_A being pre-charged to Vdd, the control logic circuit 110 is configured to receive a clock signal 101 (FIG. 1). Such a clock signal 101 may be a global clock signal that is used to drive the whole memory device 100. In some embodiments, the clock signal 101 has a respective frequency when the memory device 100 operates under a particular mode. For example, when the memory device 100 is in use for a high-speed application, the frequency of the clock signal 101 may be relatively high, as illustrated in FIG. 3A; when the memory device 100 is in use for a low-speed application, the frequency of the clock signal 101 may be relatively low, as illustrated in FIG. 3B.

In some embodiments, the timing control engine 112 of the control logic circuit 110 is configured to use the rising edge of the clock signal 101, 101R (FIGS. 3A and 3B), to constitute at least part of the assert signal 103. As such, a rising edge of the assert signal 103 (i.e., 103R) is aligned with the rising edge 101R, as illustrated in FIGS. 3A and 3B. In some embodiments, the rising edge of the control signal 103R is provided to the WL driver 104 and the tracking circuit 108. Further, as described above, the rising edge of the control signal 103R is provided to at least one asserted WL of the memory array 102 (e.g., WL_a of FIG. 2A) and the tracking WL 253 of the tracking circuit 108 (FIG. 2B), respectively, such that the access transistors M5 and M6 of the bit cell 102-1, and the access transistors of all the tracking cells 250 are turned on. That is, the bit cell 102-1 and the tracking circuit 108 are allowed to perform respective operations: a read operation and an emulation operation, as described above with respect to FIGS. 2A and 2B. Once the tracking circuit 108 finishes the emulation operation (i.e., the voltage signal on the tracking BL 251 drops down to a logical low state), the tracking circuit 108 may provide the enable signal 105 to active the I/O circuit 106. More specifically, in some embodiments, the enable signal 105 may be provided as a pulse signal, as illustrated in FIGS. 3A and 3B, and the I/O circuit 106 is activated in response to a reception of a falling edge of the enable signal (i.e., 105F). In some alternative and/or additional embodiments, the enable signal may be provided as any of a variety of signals, e.g., a periodic clock signal. Also, the I/O circuit 106 may be activated in response to a reception of a rising edge of the enable signal.

As described above, in some embodiments, the timing control engine 112 of the control logic circuit 110 is configure to compare the falling edges of the clock signal 101 and the enable signal 105, i.e., 101F and 105F, so as to determine which of these two falling edges occurs earlier. In some embodiments, the timing control engine 112 is configured to select the faster falling edge (i.e., the falling edge that occurs earlier) as the falling edge of the assert signal 103 (i.e., 103F). For example, in the illustrated embodiment of FIG. 3A, when the fast clock signal 101 is provided, the timing control engine 112 determines that the falling edge 101F occurs earlier than the falling edge 105F thereby causing the falling edge 103F to be aligned with the faster falling edge 101F. Accordingly, the falling edge 103F (the falling edge 101F) may in turn deactivate the WL_a (FIG. 2A) and the tracking WL 253 (FIG. 2B) so that the respective operations being performed by the bit cell 102-1 and the tracking circuit 108 are terminated. As shown in FIG. 3A, the BL_A and BBL_A stops being discharged, and starts to be charged back to Vdd. That is, the voltage level present on either the BL_A or the BBL_A stops decreasing at a timing about when the falling edge 101F occurs. Similarly, in the illustrated embodiment of FIG. 3B, when the slow clock signal 101 is provided, the timing control engine 112 determines that the falling edge 101F occurs later than the falling edge 105F thereby causing the falling edge 103F to be aligned with the faster falling edge 105F. As such, the falling edge 103F (the falling edge 105F) may in turn deactivate the WL_a (FIG. 2A) and the tracking WL 253 (FIG. 2B) so that the respective operations being performed by the bit cell 102-1 and the tracking circuit 108 are terminated. That is, the voltage level present on either the BL_A or the BBL_A stops decreasing at a timing about when the falling edge 105F occurs.

To recap, the timing control engine 112 of the control logic circuit 110 uses a rising edge of the global clock signal 101, e.g., 101R, as a rising edge of the assert signal 103, and selects falling edges of the global clock signal 101 and the emulated enable signal 105, e.g., 101F and 105F, as a falling edge of the assert signal 103, in accordance with some embodiments. As such, a time window for the memory device 100 to perform a respective operation is determined accordingly. In an example, a time window "TW1," as illustrated in FIG. 3A, is selected as a time duration from the rising edge to the falling edge of the assert signal 103 that are defined by the rising edge 101R and the falling edge 101F, respectively. In another example, a time window "TW2," as illustrated in FIG. 3B, is selected as a time duration from the rising edge to the falling edge of the assert signal 103 that are defined by the rising edge 101R and the falling edge 105F, respectively.

Figure 4:
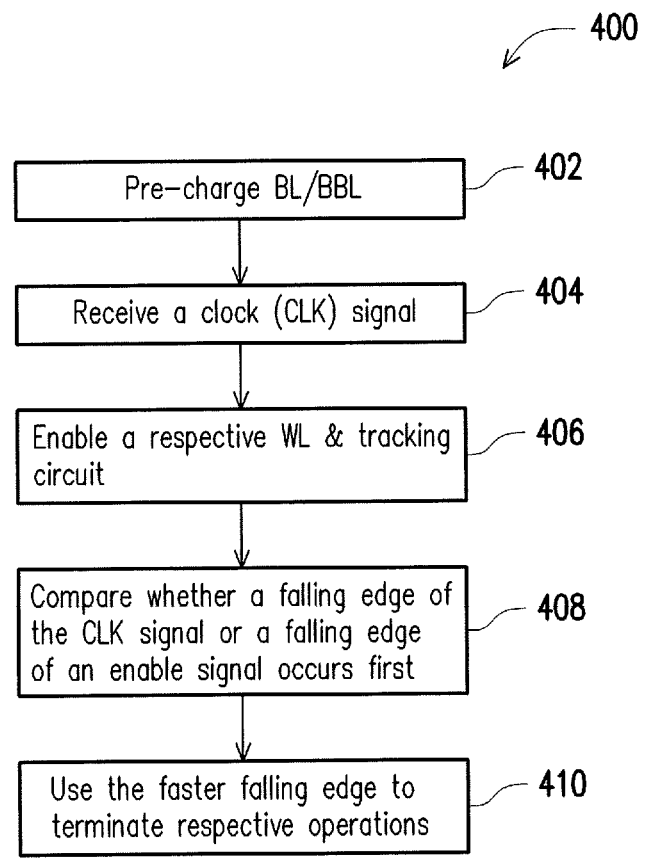
FIG. 4 illustrates a flow chart of a method to operate the memory device of FIG. 1, in accordance with various embodiments.

FIG. 4 illustrates a flow chart of a method 400 to determine a time window during which an operation is performed on the memory device 100, in accordance with various embodiments. In various embodiments, the operations of the method 400 are performed by the respective components illustrated in FIGS. 1-3. For purposes of discussion, the following embodiment of the method 400 will be described in conjunction with FIGS. 1-3. The illustrated embodiment of the method 400 is merely an example. Therefore, it should be understood that any of a variety of operations may be omitted, re-sequenced, and/or added while remaining within the scope of the present disclosure.

The method starts with operation 402 in which the BL's (and BBL's) and the tracking BL of the memory device 100 are pre-charged to a nominal voltage reference (e.g., Vdd), in accordance with various embodiments. More specifically, voltage levels present on the BL's/BBL's and tracking BL of the memory device 100 are each pre-charged to Vdd by a pre-charge circuit (not shown) of the memory device 100. In some alternative embodiments, the voltage levels present on the BL's and BBL's may be pre-discharged to another nominal voltage reference (e.g., ground).

The method continues to operation 404 in which a clock signal (e.g., 101) is received by the memory device 100, in accordance with various embodiments. Such a clock signal 101 is globally provided to the whole memory device 100, and may be used by each component of the memory device 100. More specifically, the clock signal has a series of pairs of rising and falling edges, wherein each pair is separated by a time period (i.e., a half of the clock signal 101's time period).

The method continues to operation 406 in which the WL driver 104 and the tracking circuit 108 of the memory device 100 are enabled, in accordance with various embodiments. More specifically, the timing control engine 112 of the control logic circuit 110 is configured to use the rising edge of the clock signal 101 as the rising edge of the assert signal 103. In response to receiving the rising edge of the assert signal 103, the WL driver 104 may assert at least one particular WL's of the memory array 102, and the tacking WL 253 of the tracking circuit 108 may be asserted. As such, one or more bit cells along the asserted WL (e.g., the bit cell 102-1) is allowed to be read or write, and the tracking cells 250 of the tracking circuit 108 is allowed to emulate an electrical signal path propagating across the memory array 102. Accordingly, the BL_A and/or BBL_A coupled to the allowed bit cell 102-1, and the tracking BL 251 start to be discharged. Subsequently, in some embodiments, when the tracking BL 251 is discharged to a logical low state, the enable signal 105 is generated, and more specifically, the enable signal 105's falling edge corresponds to a simulated timing when a large enough voltage difference has been present between the bit cell 102-1's BL and BBL, BL_A and BBL_A.

The method continues to operation 408 in which the falling edges of the clock signal 101 and the enable signal 105 are compared to determine which of these two occurs earlier, in accordance with various embodiments. In some embodiments, after the enable signal 105 is generated, the timing control engine 112 is configured to select a faster falling edge between the falling edges of the clock signal 101 and the enable signal 105, i.e., which of these two occurs first.

The method continues to operation 410 in which the faster falling edge is used to terminate respective ongoing operations of the asserted bit cell (e.g., 102-1) and the tracking circuit 108, in accordance with various embodiments. After the faster falling edge is selected to be the falling edge of the assert signal 103, in some embodiments, the timing control engine 112 uses the falling edge of the assert signal 103 to terminate the ongoing operation (i.e., either a read or a write operation) of the bit cell 102-1 by turning off the access transistors M5 and M6 (FIG. 2A), and the ongoing operation (i.e., the emulation operation) of the tracking circuit 108. More specifically, after the ongoing operations are terminated, the respective BL's (e.g., the BL_A and the BBL_A of the memory array 102, and the tracking BL 251) are pre-charged back to Vdd, and the memory device 100 may return to a stand-by mode to wait for a subsequent operation.

In an embodiment, a memory device is disclosed. The memory device includes a memory array that comprises at least a bit cell configured to store a data bit; a tracking circuit, coupled to the memory array, and configured to provide an enable signal in response to a first timing edge of a clock signal, wherein the enable signal emulates an electrical signal path propagating the memory array; and a control logic circuit comprising a timing control engine coupled to the tracking circuit, wherein the timing control engine is configured to select a faster timing edge between a second timing edge of the clock signal and a third timing edge of the enable signal so as to terminate an ongoing operation of the bit cell.

In another embodiment, a memory device includes a memory array that comprises at least a bit cell configured to store a data bit; a tracking circuit, coupled to the memory array, and configured to provide an enable signal in response to a rising edge of a global clock signal, wherein the enable signal emulates an electrical signal path propagating the memory array; and a control logic circuit comprising a timing control engine coupled to the tracking circuit, wherein the timing control engine is configured to select a faster falling edge between a falling edge of the global clock signal and a falling edge of the enable signal so as to terminate an ongoing operation of the bit cell.

Yet in another embodiment, a method to operate a memory array includes pre-charging a bit line (BL) and a bit bar line (BBL) of a bit cell of the memory array and a tracking BL of a tracking circuit to a logical high; providing an enable signal in response to a rising edge of a clock signal, wherein the enable signal emulates an electrical signal path propagating the memory array; comparing whether a falling edge of the clock signal or a falling edge of the enable signal occurs first; and using the falling edge that occurs first to stop discharging the BL and the BBL of the bit cell and the tracking BL.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array that comprises at least a bit cell configured to store a data bit;
   a tracking circuit, coupled to the memory array, and configured to provide an enable signal in response to a first timing edge of a clock signal, wherein the enable signal emulates an electrical signal path propagating the memory array; and
   a control logic circuit comprising a timing control engine coupled to the tracking circuit, wherein the timing control engine is configured to select a faster timing edge between a second timing edge of the clock signal and a third timing edge of the enable signal so as to terminate an ongoing operation of the bit cell.

2. The memory device of claim 1, wherein the tracking circuit comprises a plurality of tracking cells, a tracking bit line (BL), and a tracking word line (WL).

3. The memory device of claim 2, wherein the third timing edge of the enable signal corresponds to a timing when a voltage level of the tracking BL decreases from a logical high to a logical low.

4. The memory device of claim 1, wherein the first timing edge corresponds to a rising edge of the clock signal, the second timing edge corresponds to a falling edge of the clock signal that occurs immediately after the first timing edge, and the third timing edge corresponds to a falling edge of the enable signal.

5. The memory device of claim 1, wherein the bit cell includes a static-random-access memory (SRAM) bit cell.

6. The memory device of claim 1, wherein the clock signal is a global clock signal that is globally used by the memory device.

7. The memory device of claim 1, further comprises a plurality of sensing amplifiers, wherein at least one of the plurality of sensing amplifiers is coupled to the bit cell and configured to read a logical state of the data bit based on voltage levels present on a bit line (BL) and a bit bar line (BBL) coupled to the bit cell.

8. The memory device of claim 1, wherein the bit cell is coupled to a respective word line (WL), and wherein when the WL receives the first timing edge of the clock signal, the bit cell is configured to perform a respective ongoing operation by discharging a bit line (BL) or a bit bar line (BBL) coupled to the bit cell.

9. The memory device of claim 8, wherein the timing control engine is configured to use a faster timing edge selected from the second and third timing edges to terminate the ongoing operation by stop discharging the BL and the BBL.

10. A memory device, comprising:
- a memory array that comprises at least a bit cell configured to store a data bit;
- a tracking circuit, coupled to the memory array, and configured to provide an enable signal in response to a rising edge of a global clock signal, wherein the enable signal emulates an electrical signal path propagating the memory array; and
- a control logic circuit comprising a timing control engine coupled to the tracking circuit, wherein the timing control engine is configured to select a faster falling edge between a falling edge of the global clock signal and a falling edge of the enable signal so as to terminate an ongoing operation of the bit cell.

11. The memory device of claim 10, wherein the tracking circuit comprises a plurality of tracking cells, a tracking bit line (BL), and a tracking word line (WL).

12. The memory device of claim 11, wherein the falling edge of the enable signal corresponds to a timing when a voltage level of the tracking BL decrease from a logical high to a logical low.

13. The memory device of claim 10, further comprises a plurality of sensing amplifiers, wherein at least one of the plurality of sensing amplifiers is coupled to the bit cell and configured to read a logical state of the data bit based on voltage levels present on a bit line (BL) and a bit bar line (BBL) coupled to the bit cell.

14. The memory device of claim 10, wherein the bit cell is coupled to a respective word line (WL), and wherein when the WL receives the rising edge of the global clock signal, the bit cell is configured to perform a respective ongoing operation by discharging a bit line (BL) or a bit bar line (BBL) coupled to the bit cell.

15. The memory device of claim 10, wherein the timing control engine is configured to use the faster timing edge to terminate the ongoing operation by stop discharging the BL and the BBL.

16. The memory device of claim 10, wherein the timing control engine is configured to use a faster timing edge selected from the falling edge of the global clock signal and the falling edge of the enable signal to terminate the ongoing operation by stop discharging a tracking bit line (BL) of the tracking circuit.

* * * * *